United States Patent [19]

Theilheimer

[11] 3,840,872

[45] Oct. 8, 1974

[54] VARIABLE RELUCTANCE ENCODER

[75] Inventor: Werner Theilheimer, Norwalk, Conn.

[73] Assignee: United Aircraft Corporation, East Hartford, Conn.

[22] Filed: May 14, 1973

[21] Appl. No.: 359,833

[52] U.S. Cl. .......................... 340/347 P, 340/347 AD

[51] Int. Cl. .......................................... G08c 9/08

[58] Field of Search ......... 340/347 P, 347 AD, 151, 340/147; 310/168; 324/115

[56] References Cited

UNITED STATES PATENTS

| | | | |
|---|---|---|---|
| 3,113,300 | 12/1963 | Sullivan | 340/347 P |
| 3,268,884 | 8/1966 | Vanis et al. | 340/347 P X |
| 3,314,063 | 4/1967 | Brothman et al. | 340/347 P |
| 3,513,469 | 5/1970 | Christensen et al. | 340/347 P |
| 3,614,774 | 10/1971 | Clements | 340/347 P |

*Primary Examiner*—Joseph F. Ruggiero
*Attorney, Agent, or Firm*—M. P. Williams

[57] ABSTRACT

In a multi-stage, decaded encoder for encoding the position of a plurality of shafts (such as the shafts of a watt-hour meter), each stage includes an edge-coded ferromagnetic code disc which is disposed for rotation about, but independently of, the shaft to be encoded. In one embodiment, the code disc has a permanent magnet which is repelled by a magnet disposed for rotation with the shaft. In another embodiment, the code disc has a tab extending outwardly of its principal surface, which is attracted by the shaft magnet. Each disc is normally held from rotation by a small magnetic field; the interposition of an opposing magnetic field releases the disc so that it moves in response to the force of the shaft magnet, whereby the disc periodically assumes a position dictated by the rotary position of the shaft. Ambiguity is avoided by releasing the disc of each decade for advancement by one tenth of a revolution in response to the next lower decade having completing a full revolution; in the lowest ordered stage, ambiguity is avoided in one embodiment by means of a unit distance code, and in another embodiment by a timing disc. An interrogation coil is coaxially disposed in proximity with each code disc, and sensing poles conduct flux from the code disc to a plurality of sensing coils in a coded fashion, depending on the position of the edge-coded disc. The sensing coils may be shared among the various stages.

14 Claims, 12 Drawing Figures

PATENTED OCT 8 1974 3,840,872
SHEET 5 OF 6
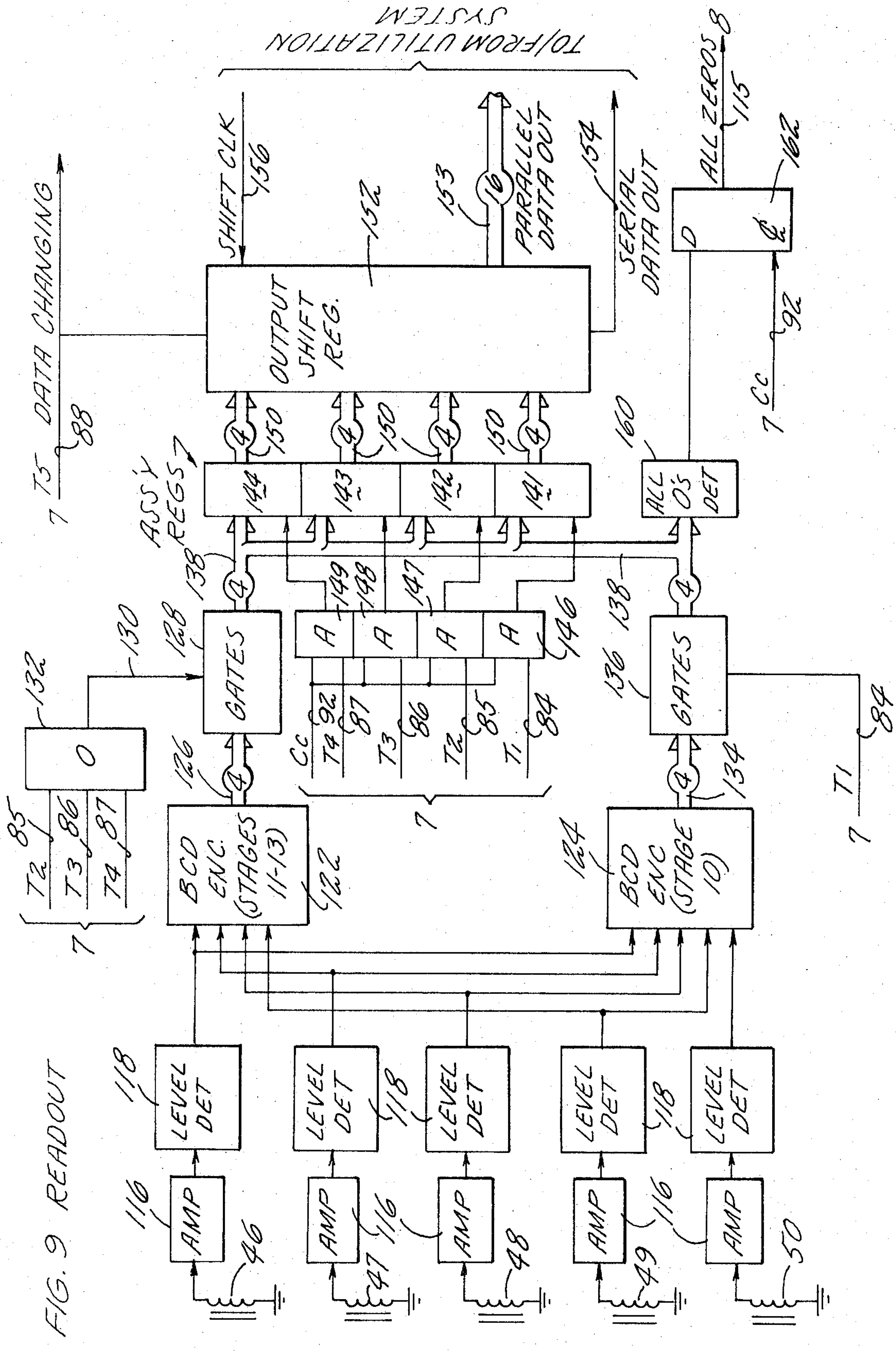
FIG. 9 READOUT

VARIABLE RELUCTANCE ENCODER

BACKGROUND OF THE INVENTION

1. Field of Invention

This invention relates to shaft angle encoders, and more particularly to a variable reluctance encoder.

2. Description of the Prior Art

There are many devices known to the art for providing electrical manifestations of the rotary position of a shaft or the like. Sometimes these are referred to as shaft angle encoders, or analog to digital converters. Many techniques have been utilized including the use of electrical contacts with brushes, photo detection, and magnetic or capacitive sensing.

The utilization of shaft angle encoders has recently become of interest to public utilities in order to provide remote reading of watt-hour meters, gas volume meters, and water meters. Numerous systems have been built and are being evaluated; a number of these are described in an article of S. J. Bailey, *Remote Reading Of Utility Meters*, Control Engineering, June 1972, pp 52–57. In order to transmit electrical signals indicative of a meter reading to a central station, some systems propose the use of radio telemetry; others propose the use of telephone lines; while still others propose the use of the power lines themselves as carriers for the signals. Despite the nature of the system, all systems require a method of first transposing the shaft positions of the meter to some form of electric signal or signals that can be transmitted. Because the meters are typically decaded (that is, having several orders, each being a power of 10 higher than the next lower one thereto in a sequence), it is common to employ binary coded decimal signals, usually in serial form.

The adaptation to meter reading of rotary encoders widely used in the art for other purposes has been found to be less than satisfactory. This is due to a variety of factors with respect to different encoders. One problem is the requirement that the encoder be producible at extremely low cost, since encoders must be applied to each meter of all of the customers of the utility. The cost factor must not only be competitive with manual reading by meter readers, but must also provide additional advantages to offset disadvantages of changing from one system to another, the impact upon utility personnel, and so forth. In addition, responsible design specifications for such encoders may require a normal, unserviced life of at least 20 years. Further, the temperatures at which such devices must operate may range from −50°F (in the Northwest in the winter time) to above +200°F (inside of a meter case in the summer desert sun). These factors impose severe restraints on the components which may be used in meter encoders. For instance, photodetective devices (such as cadmium sulfide cells) cannot perform reliably at the extreme temperatures required. Brush-type contact encoders are not easily produced to have the required service life, and the exposed contacts thereof are prohibited whenever the encoder is to be used in an explosive environment. Any system requiring a large amount of electronics per meter increases the cost and unreliability factor beyond permissible limits.

Another factor with respect to encoders known in the art is the well known problem of ambiguity, which is typically overcome by providing duplicity of sensing elements so as to unambiguously determine at any position only a single output reading. When a single stage (a single code disc or element) is involved, ambiguity can be avoided by use of a unit distance code. But, whenever more than one stage is to be encoded (as in the decaded stages of a watt-hour meter), the total reading among stages becomes ambiguous because of the impossibility of causing each stage to transfer from one reading to the next precisely as the next lower stage is completing a revolution. Thus, means for resolving ambiguity between the stages is required in all multistage encoders. However, the multiplicity of sensing elements and additional electronic logic required for such devices renders them too expensive and complex for utilization in the encoding of utility meters.

SUMMARY OF INVENTION

One object of the present invention is to provide an improved encoder suitable for use in encoding the setting of utility meters.

An object of the present invention is the provision of an improved, simple, low cost decaded encoder.

In accordance with a first aspect of the present invention, the position of a shaft is sensed by sensing changes in reluctance between a protrusion-coded ferromagnetic code disc and a plurality of magnetic circuits that surround the disc. In further accord with this aspect of the invention, in a multi-stage variable reluctance encoder, a single group of sensing coils may be utilized to sense the position of a plurality of discs, in a time division, or sequential, multiplexed fashion.

In accordance with another aspect of the present invention, ambiguity as between stages is overcome by the advancing of each code disc in equal steps by means of simple, passive magnetic elements, the advancement of each stage being timed to the completion of a revolution of the next lower stage. In accordance still further with this aspect of the invention, ambiguity of the lowest order stage is eliminated by using a unit distance code or a high resolution timing disc.

In accord with yet another aspect of the present invention, each code disc is rendered stationary by means of magnetic attraction, and a periodically applied opposing magnetic field unlatches the code disc and allows it to advance to the position of the shaft, thereby to achieve stepped advancement.

The present invention provides an extremely simple, reliable and low cost multiple-turn shaft angle encoder which is readily adapted to encode the position of decaded, multishaft devices, such as watt-hour meters. The present invention is readily implemented in a form in which wear from use is substantially immaterial to the operation of the device. The device is "fail safe" in that, in the absence of power, the device completely shuts down and retains the setting which it last achieved prior to loss of power. The invention is particularly well suited to decade encoding, and to serial transmission of data, including the attendant advantage of multiple usage of parts, in a multiplex fashion. The invention can be implemented utilizing readily available materials, such as spool wound coils and regular lamination steel (such as silicon steel). As such, devices in accordance with the present invention are substantially immune to environmental effects, being operable over extremely wide temperature ranges, in sunlight, under conditions of high humidity, with condensation, and so forth.

The present invention is not only readily adapted to the reading of utility meters for billing purposes, but for extremely rapid updated readings of meters in order to determine specific time history of utility usage, such as temporal demand of individual customers.

Although disclosed primarily as implementable for reading of watt-hour meters and the like, the invention is readily adapted to a variety of multi-shaft encoder applications.

Other objects, features and advantages of the present invention will become more apparent in the light of the following detailed description of preferred embodiments thereof, as illustrated in the accompanying drawing.

BRIEF DESCRIPTION OF THE DRAWING

FIGS. 7–9 are simplified schematic block diagrams of an electrical system which may be utilized in conjunction with the embodiments hereof;

FIG. 11 is a schematic diagram of circuitry for use with the embodiment of FIGS. 5 and 6.

DESCRIPTION OF THE PREFERRED EMBODIMENT

Figure 1:
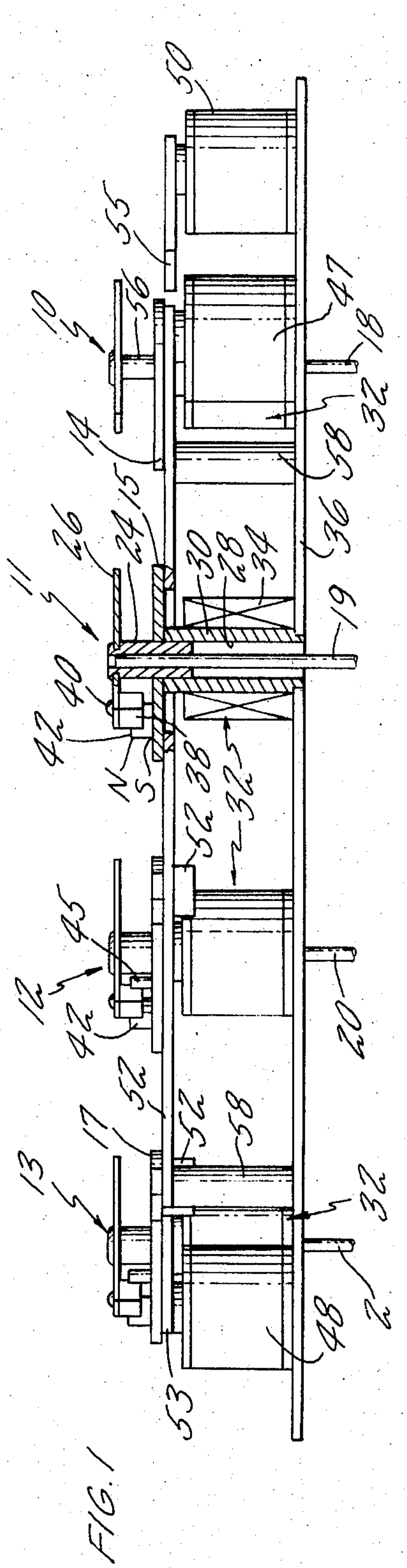
FIG. 1 is a plan view of a preferred embodiment of the present invention.

Referring now to FIG. 1, a preferred embodiment of a multi-stage, decaded shaft angle encoder in accordance with the present invention comprises a low order stage 10 and three successively higher-ordered stages 11–13. Each stage includes edge-coded (salient pole) ferromagnetic code disc 14–17 serving to encode the rotary position of a related shaft 18–21 of, for instance, a watt-hour meter.

Figure 2:
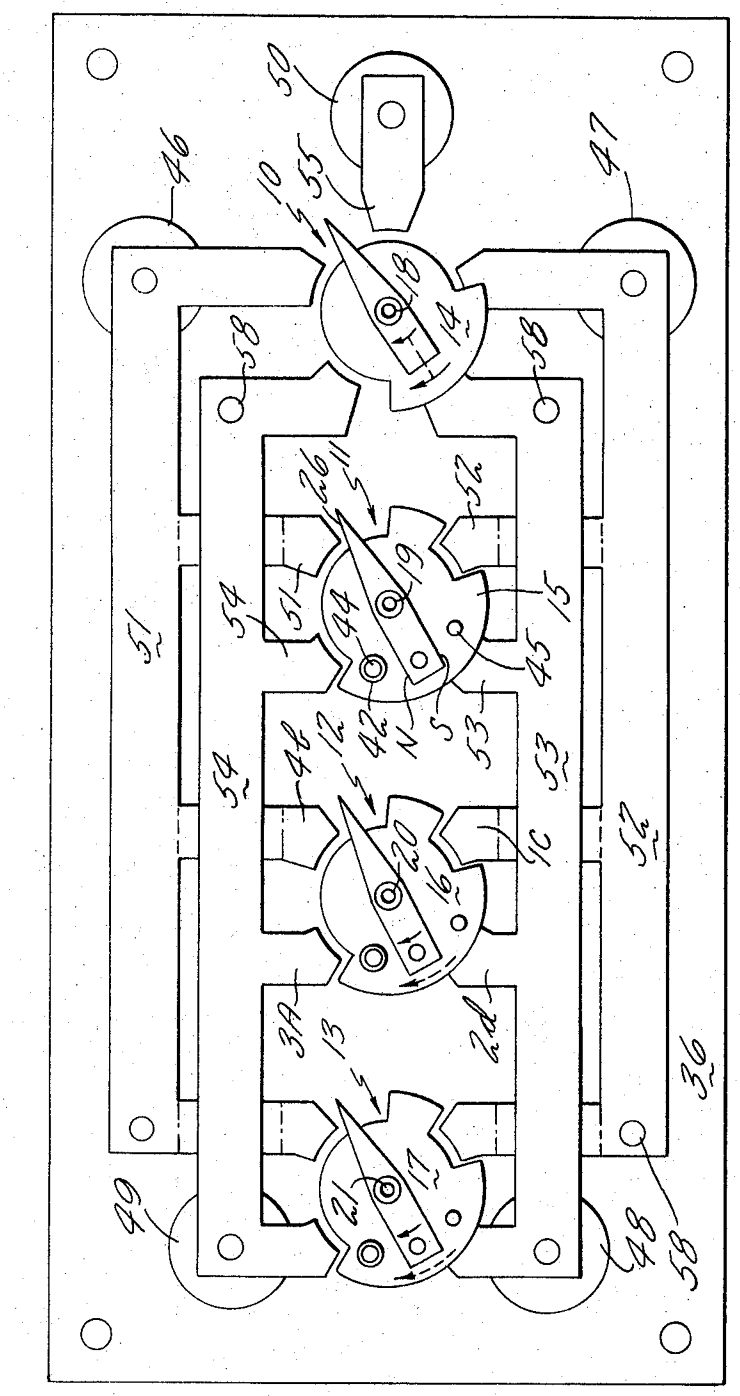
FIG. 2 is a partially sectioned side elevation view of the embodiment of FIG. 1.

Referring in FIGS. 1 and 2 to stage 11, which is identical to stages 12 and 13, the code disc 15 is loosely fit around a brass pointer hub 24 which is press fit onto the shaft 19. The shaft 19 may typically comprise the shaft of the tens order of a watt-hour meter. The top of the brass hub 24 is necked down to receive a pointer 26 which is comprised of non-magnetic material, such as aluminum. The necked portion of the hub 24 is peened over so as to rivet the shaft to it. The hub 24 fits loosely within an axial bore 28 of a core 30 of an electromagnet 32 including a spool wound coil 34. The lower end of the core 30 is necked down and passes through a hole in a base plate 36 to which it is suitably swaged or riveted so as to be affixed thereto.

The pointer 26 has a permanent magnet 38 suitably affixed thereto such as by a rivet 40. Alternatively, the pointer 26 may be provided with fold-over ears to retain the magnet 38, or other suitable fastenings may be used as desired. The magnet 38 is provided with north and south poles in its clockwise and counterclockwise ends (as indicated in FIG. 1).

The code disc 15 has a permanent magnet 42 suitably disposed thereon, such as by a rivet 44. The magnet 42 may be oriented with its north pole up and its south pole down (as seen in FIG. 2), or otherwise suitably disposed so that there is repulsion between the magnet 42 and the magnet 38. The disc 15 has a brass stop pin 46, which limits the motion of the code disc 15 with respect to the pointer 26, as is described more fully hereinafter.

In order to sense the position of the code disc, a plurality of sensing coils 46–50 are each associated with magnetic poles 51–55, the sensing coils 46–49 relating to all four stages 10–13 due to the multi-arm configurations of the poles 51–54, and the sensing coil 50 relating through the pole 55 only to the stage 10. The electromagnets 32 relating to each of the stages 10–13 are pulsed in turn, and depending on the reluctance between the respective code discs 14–17 and the poles 51–55, each of the sensing coils 47–50 will either have a substantial voltage or an inconsequential voltage induced therein. Thus the pattern of voltages established in the sensing coils 46–50 identifies the pattern of reluctance and therefore the position of the related code disc 14–17 whenever a corresponding one of the coils or stages 10–13 is energized.

The code for stage 10 is a unit distance code and is as follows (considering the disc 10 to be between positions 1 and 2 as shown in FIG. 1):

TABLE I

| POS. | STAGE 10 CODE 46 | 47 | 48 | 49 | 50 |
|---|---|---|---|---|---|
| 0 | 0 | 0 | 1 | 0 | 0 |
| 1 | 0 | 0 | 1 | 1 | 0 |
| 2 | 0 | 0 | 0 | 1 | 0 |
| 3 | 0 | 0 | 0 | 1 | 1 |
| 4 | 0 | 0 | 0 | 0 | 1 |
| 5 | 1 | 0 | 0 | 0 | 1 |
| 6 | 1 | 0 | 0 | 0 | 0 |
| 7 | 1 | 1 | 0 | 0 | 0 |
| 8 | 0 | 1 | 0 | 0 | 0 |
| 9 | 0 | 1 | 1 | 0 | 0 |

Since only one bit changes at a time, there is no ambiguity as the code disc 14 advances in position. Therefore, the code disc 14 may be press fitted to a brass hub 56 (similar to hub 24 of stage 11), or otherwise disposed for rotation with the shaft 18 along with the pointer, and moves continuously in response to the units order of the watt-hour meter.

However, to avoid ambiguity among stages, the code disc 15–17 of the stages 11–13 are selectively advanced only when the next lower order stage has advanced from 9 to 0, even though the related pointers rotate continuously with the associated shafts 19–21. To accomplish this, a small magnetic field is applied to each of the code discs 15–17 in any suitable fashion. For instance, the coils 32 relating to each of the stages 11–13 may be provided with permanent remanent magnetic fields sufficient to attract the code discs 15–17 to the related core 30 with sufficient force so that the disc will remain stationary. Alternatively, the magnetic field may be provided by an auxiliary permanent magnet 56 as illustrated in FIGS. 3–6. When the next lower decade has advanced one full revolution, the coil 34 of the related electromagnet 32 can be provided with current so as to generate a counter magnetic flux and thereby release the corresponding code disc 15–17. When released, the repulsion between the magnets 38, 42 will cause the disc to advance in the clockwise direction (as indicated by the broken arrows in FIG. 1) until it reaches a rotational position where the stop pin 45 is in contact with the pointer 26. Since the shafts 18–21 are geared together in a decaded fashion, as the next lower stage completes a full revolution, the current stage will have advanced one tenth of a revolution. Thus the code discs 15–17, by being advanced only in response to completion of the revolution of the next lower stage, will advance from one discrete position to another discrete position each time it is released or unlocked. This is an important aspect of the present invention that avoids ambiguity without the necessity for lead lag encoding or other known accommodations for ambiguity. As described more fully with respect to FIGS. 7–10 hereinafter, each of the stages 11–13 may be unlatched many times during a period of time that the next lower-ordered stage rests at its zero position. This will cause the stage 10–13 to creep one-tenth of a position (3.6°); therefore, the arms on the poles 51–54 are less than one-tenth revolution (36°) in width by 3.6°, so that constant reluctance is provided even with creeping. Thus, when the disc is first advanced, its code pattern will overlay one edge of the arm, and after creeping it will overlay the other edge of the arm.

Once each code disc has been advanced, the countermanding magnetic force applied by the related one of the electromagnets 32 is removed so that the code disc is again attracted to the top of the core 30 of the related electromagnet 32. From that time on until the next time that the code disc is unlocked and allowed to advance, each time that stage is interrogated it will provide the same reading. Interrogation is achieved by applying a lesser current to the related electromagnet 32 of each stage in sequence. With respect to any of the arms related to the poles 51–55 which are overlayed with a segment of the related one of the discs 14–17 (pole 53, FIG. 1), there will be low reluctance in the magnetic circuit, thereby providing a significant flux to the corresponding one of the sensing coils 46–50. With respect to a pole for which the corresponding arm is not overlayed with a sector of the disc (such as the poles 51, 52 and 54, with the code disc 15 in the position shown in FIG. 1), there will be a substantial air gap, with a large reluctance, and therefore only a small magnetic induction in the related one of the sensing coils 46–50. The code discs and poles could, of course, be arranged in the same plane to provide edge-to-edge magnetic paths; however, this is not preferred because the magnetic coupling would be lower than with the overlapping illustrated in FIGS. 1 and 2. As shown, the sensing coils 46–49 relate to all four of the stages; however, if desired, separate sensing coils could be provided for each stage in the manner illustrated in FIGS. 3–6. The code for the discs 15–17 (assuming they are shown registering 2 in FIG. 1) is as follows:

TABLE II

| POS. | STAGES 11 - 13 CODE 46 | 47 | 48 | 49 |
|---|---|---|---|---|
| 0 | 1 | 1 | 1 | 0 |
| 1 | 0 | 1 | 1 | 0 |
| 2 | 0 | 0 | 1 | 0 |

TABLE II-Continued

| POS. | STAGES 11 - 13 CODE 46 | 47 | 48 | 49 |
|---|---|---|---|---|
| 3 | 0 | 1 | 1 | 1 |
| 4 | 0 | 0 | 0 | 1 |
| 5 | 1 | 0 | 1 | 1 |
| 6 | 1 | 0 | 0 | 1 |
| 7 | 1 | 0 | 0 | 0 |
| 8 | 1 | 1 | 0 | 1 |
| 9 | 0 | 1 | 0 | 0 |

In the embodiment of FIGS. 1 and 2, it is necessary to affix the pin 45 and the magnet 42 in such a fashion that there are no protrusions on the lower sides of the code discs 15–17 which could interfere with and catch on the arms of the poles 51–54. Thus, the lower head of the rivet 44 may be recessed into the bottom surface of the code discs 15–17, or other suitable accommodations may be provided, as desired. Similarly, the tops of the cores 30 may preferably be made higher than the upper surfaces of the poles 51–55 so as to eliminate the chance of the discs 14–17 being caught by the poles 51–55 as they advance. The edges of the discs 14–17 and of the poles 51–55 may be rounded (as in the stamping process or by tumbling) to further minimize interference therebetween.

The base plate 36 consists of a ferromagnetic material in order to provide return flux paths for the entire encoder, and may comprise ordinary lamination steel, such as silicon steel. The poles 51–54 are each positioned with respect to the base plate by means of swaging or press fitting of the related one of the sensing coils 46–50, as well as by means of spacers 58 made of brass or other non-ferromagnetic material. The spacers 58 may be provided with shoulders having reduced portions fit through appropriate holes in the base and in the related pole, with the ends peened over in the fashion of rivets.

Figure 3:
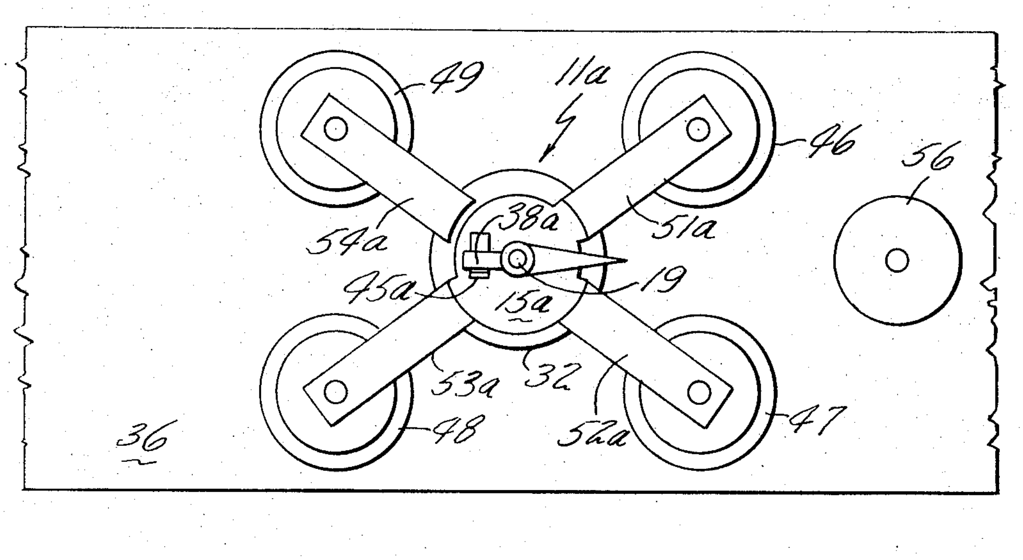
FIG. 3 is a partial plan view of alternative code disc structure which may be employed in the embodiment of FIG. 1.
Figure 4:
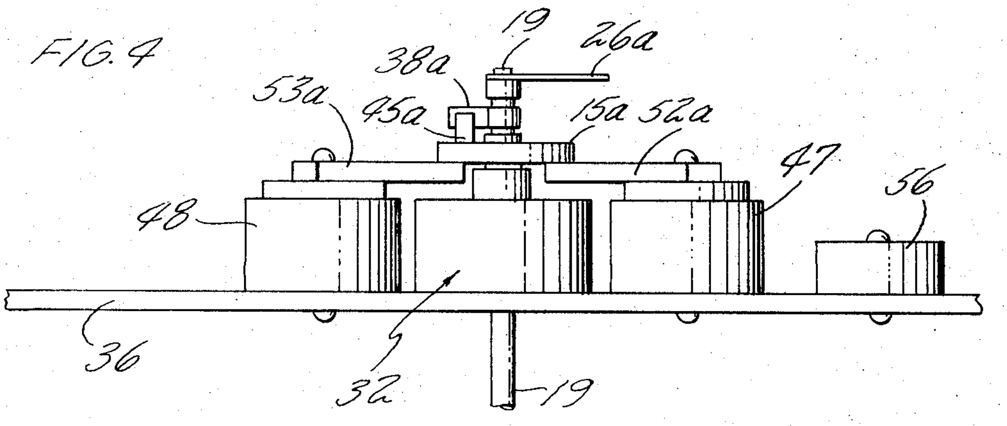
FIG. 4 is a partial side elevation view of the alternative structure of FIG. 3.

An alternative form of the invention is illustrated in FIGS. 3 and 4. Therein, a single stage **11*a* is illustrated as having a full set of sensing coils 46–49 with correspondingly simplified poles 51*a*–54*a*. In addition, instead of using a pair of repelling magnets 38, 42 as in the embodiment of FIGS. 1 and 2, the embodiment of FIGS. 3 and 4 includes a single magnet 38*a*, disposed on the shaft 19, which simply attracts a tab 45*a* whenever the disc 15*a* is released in the fashion described hereinbefore with respect to FIGS. 1 and 2. The tab 45*a* may simply be stamped out of the disc 15*a* in a well known fashion. Thus, a variety of passive magnetic motive means (38, 42; 38*a*, 45*a***) may be used to provide a rotative force to the code disc with respect to the rotary position of the shaft.

Figure 5:
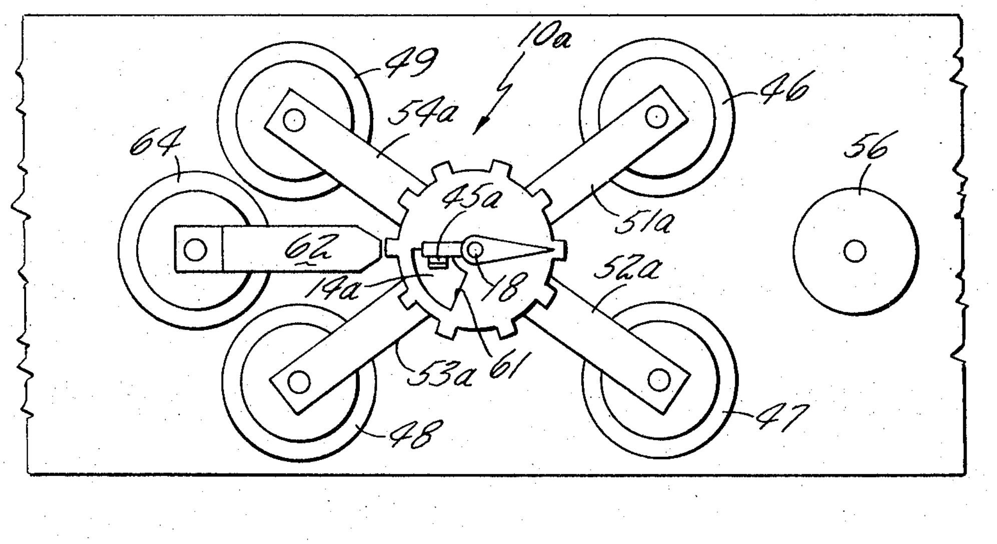
FIG. 5 is a partial plan view of an alternative low-order stage which may be employed in the embodiment of FIG. 1.
Figure 6:
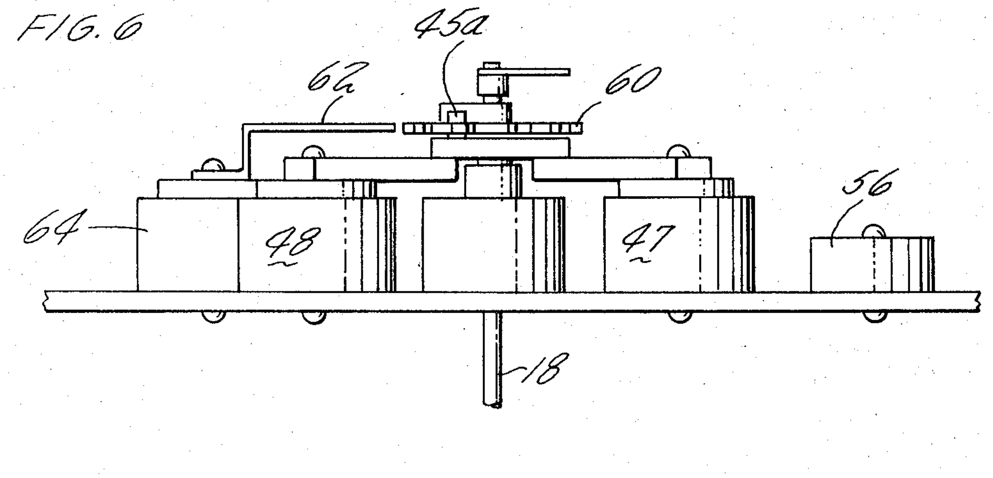
FIG. 6 is a partial side elevation view of the alternative structure of FIG. 5.

Another modification of the invention is illustrated in FIGS. 5 and 6. Therein, the lowest ordered stage **10*a* is identical with the embodiment of FIGS. 3 and 4 except that it additionally includes a timing disc 60 having narrow poles which cooperates with a narrow pole piece 52 and a special sensing magnet 64 that comprise a means of detecting the transition between successive pointer positions within a small angle to initiate the unlatch command of the lowest order stage 10*a*. In this embodiment, the code disc 14*a* of the lowest ordered stage 10*a* is similar to that shown in FIGS. 3 and 4 and is held stationary except when it is unlocked for advancement, which is made to occur only when the timing disc 60 is aligned with the pole piece 62 as shown in FIG. 5, and the disc 14***a* may be the same as the discs 15–17. The timing disc 60 is provided with a clearance hold 61 for the tab 45*a*. In all other respects, this embodiment may be similar to the embodiment of FIGS. 1 and 2, as described hereinbefore. Thus, only the high order stages (11–13) of the embodiment of FIGS. 1 and 2 comprise discrete advancement stages, whereas all of the stages (10–13) comprise discrete advancement stages in a modification according to FIGS. 5 and 6.

It should be noted that the utilization of an auxiliary magnet 56, rather than having remanence in the interrogation electromagnets 32 of FIG. 1, may be utilized in the configuration of the embodiment of FIGS. 1 and 2; similarly, the single magnet 38*a* and tab 45*a* may be utilized in an overall configuration similar to that of FIGS. 1 and 2 if desired. The utilization of a timing disc 60 on a low order stage which is only selectively released in response thereto may be utilized in an overall configuration similar to that shown in FIGS. 1 and 2 if desired. In other words, the alternative features disclosed in FIGS. 1–6 may be combined in various manners as desired, in an obvious fashion. However, the embodiment of FIGS. 5 and 6 includes an extra disc 60 which adds weight that must be rotated by the lowest ordered shaft 18. In some situations, it may be necessary to limit the total weight disposed on the shaft 18 (which rotates at the highest speed, since it is the lowest ordered position) to as little as 250 milligrams. In such a case, the embodiment of FIGS. 1 and 2 is to be preferred with respect to the lowest ordered stage. Similarly, the repulsion between two magnets (as in FIGS. 1 and 2) is preferred over attraction by a single magnet (as in FIGS. 3 and 4) because it provides highest torque to initiate advancement and lowest torque as the disc reaches the stop; but the embodiment of FIGS. 3 and 4 may be cheaper and have less weight.

Figures 7, 8, 11:
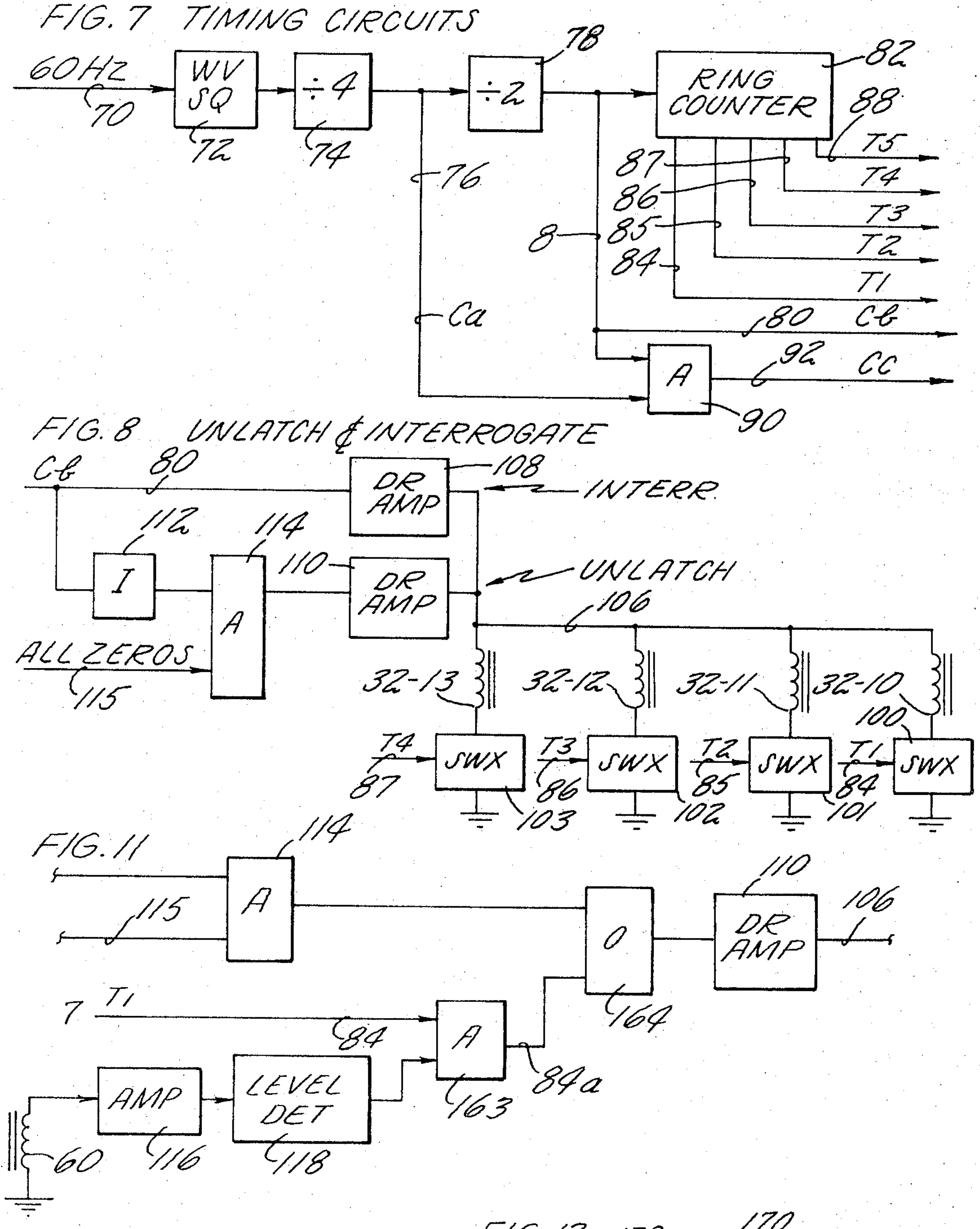
Figure 10:
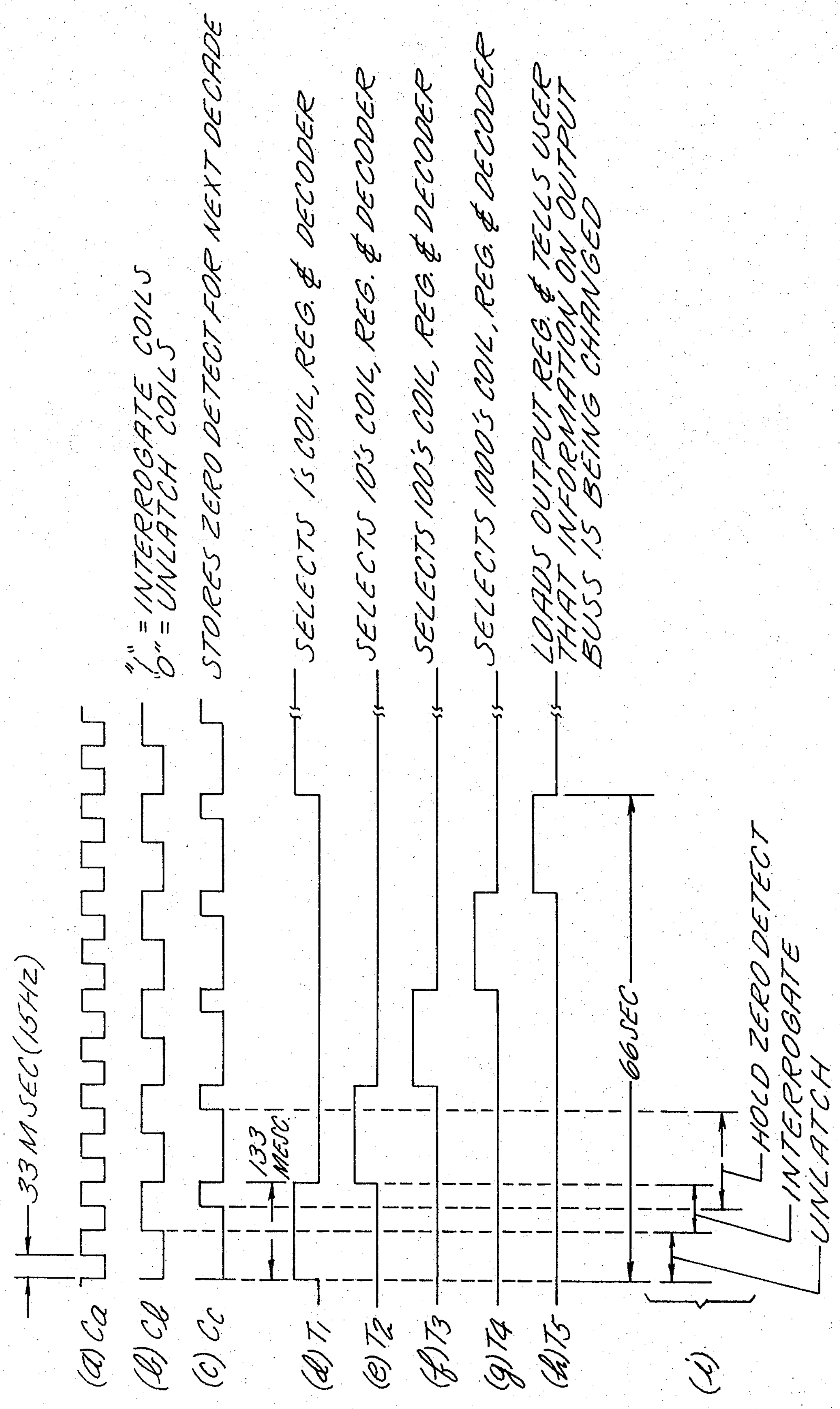
FIG. 10 is a timing diagram illustrating typical operation of the disclosed embodiments.

Exemplary electronic circuitry which may be utilized to control the operation of the various embodiments of FIGS. 1–6 described hereinbefore is illustrated in FIGS. 7–9, and the timing thereof is illustrated in FIG. 10. In FIG. 7, timing signals are derived from any suitable source such as a 60 Hz power line 70, which is converted into a square wave by a wave squaring circuit 72. The 60 Hz signal is passed through a divide by four circuit 74 so as to provide a 15 Hz clock signal ($C_a$) on a line 76 (illustration (a), FIG. 10). This signal is in turn passed through a divide by two circuit 78 so as to provide a 7½ Hz clock signal ($C_b$) on a line 80 (illustration (b), FIG. 10). The signal on the line 80 advances a ring counter 82 so as to provide five successive timing signals on a plurality of lines 84–88 (illustrations (d) – (h), FIG. 10). The $C_a$ signal on the line 76 and the $C_b$ signal on the line 80 are combined in an AND circuit 90 so as to provide a $C_c$ clock signal on a line 92 (illustration (c), FIG. 10).

The unlatching for advancement and interrogation of each of the stages 10–13 is accomplished, as shown in FIG. 8, by selectively connecting the electromagnet 32 associated with each respective stage 10–13 to ground by means of a related switch 100–103, which may preferably be electronic switches, such as bipolar or field effect transistors, that are selectively energized by the respective timing signals on the lines 84–87. The opposite ends of the coils 32 are connected in common to a line 106 which may have current applied thereto by either one of two driver amplifiers 108, 110. The driver amplifier 108 is used to interrogate the respective coils 32 by supplying a relatively small current to the one of the coils 32 which is connected to ground through its related switch 100–103, and the driver amplifier 110 is used to unlatch the code discs 14–17 by supplying a relatively high current to the one of the electromagnets 32 which is connected to ground. Although the unlatching signals from the driver amplifier 110 inherently also cause selected signals to be induced in the sensing coils 46–50, these are immaterial, as described with respect to FIG. 9 hereinafter. The driver amplifier 108 is operated in response to each of the $C_b$ timing signals on the line 80. These signals are also applied to an inverter 112 so as to enable an AND circuit 114 at times other than the times of the signal $C_b$, so that when an all zeros condition is detected in a lower order stage, as indicated by an all zeros signal on a line 115, the AND circuit 114 will cause the driver amplifier 110 to unlatch the next higher ordered stage.

Referring to FIG. 9, whenever one of the electromagnets 32 is pulsed with current (FIG. 8), a current will be induced in some combination of the coils 46–49, and when the lowest order stage 10 is pulsed, current may also be induced in the sensing coil 50. Each of the sensing coils 46–50 is connected to a related amplifier 116 which drives a corresponding level detector circuit 118 which passes signals of a suitably high magnitude onto corresponding lines 120 for application to a pair of BCD encoders 122, 124. The encoder 122 provides a BCD output on a four bit bus 126 to a set of gates 128 which are enabled by a signal on a line 130, in response to an OR circuit 132 which in turn can be enabled by a signal on any one of the lines 85–87. In other words, whenever the second, third or fourth stages are being interrogated, the output of the encoder 122 will be passed through the gates 128. Similarly, the BCD output of the encoder 124 is applied by a four bit bus 134 to a set of gates 136 which are enabled by the T1 timing signal on the line 84 so that interrogation of the lowest ordered stage of the encoder will result in a BCD word passing through the gates 136. The gates 128, 136 are connected in common to a four bit bus 138 which is applied to a plurality of individual four bit assembly registers 141–144 each of which is selectively gated in response to the leading edge of the $C_c$ timing signal on the line 92 when a related one of a plurality of AND circuits 146–149 is enabled by a corresponding one of the timing signals T1–T4 on the lines 84–87. The data in the assembly registers naturally changes one register at a time as each stage is poled. However, although this data is applied by a plurality of four bit busses 150 to an output shift register 152, the output shift register 152 will not respond thereto until it is clocked by the T5 signal on the line 88, which may also be applied to the utilization system (not shown herein) to indicate when the data on a 16 bit parallel data output bus 153 are not valid. As an alternative, the data in the output shift register 152 may be read out serially on a serial data output line 154 in response to shift clock signals applied on the line 156 by the utilization system. In that case, the T5 signal on the line 88 may be used in the utilization system to prevent initiation of a serial data output shift. The utilization of the data in the output register 152, and the nature of the controls thereover, is immaterial to the present invention and may take a variety of forms well known in the art.

The four bit bus 138 is also applied to an all zeros detector 160 to sense when any of the stages is set at zero.

Whenever the all zeros detector 160 senses all zeros, it provides an input to a flip flop 162 which is gated by the $C_c$ clock signal on the line 92, and provides the all zeros detection signal on the line 115 for an entire 7½ Hz cycle, as shown in illustration (i) of FIG. 10. However, the all zeros detector 160 responds to different combinations of signals sensed by the sensing coils 46–50 in successive ones of the time periods T1–T5. But as each of the full cycles shown in FIG. 10 repeats itself (successive swings through T1–T5) which may occur many many times before the positions of the shafts are advanced), the all zeros condition will continuously be monitored, and when present, will be sensed and lodged in the flip flop 162. This is described hereinbefore as causing creeping of one stage as a result of the next lower stage continually resting at zero for some finite interval. If desired, additional logic could be provided so as to sense only the first occurrence of the all zeros condition of one stage in order to control the advancement of the next higher-ordered stage; however, this would not be remembered in the event that there were a power failure in the system between the first sensing of an all zeros condition for a stage and the advancement of that stage from the zero condition. But the mechanical accommodation described with respect to FIGS. 1 and 2 hereinbefore is operative even though power may be lost during the all zeros condition of any stage.

As shown herein, two different encoders 122, 124 are required since the four unit code of stages 14–17 is different than the five unit, unit distance code of stage 10. If desired, the use of two encoders could be eliminated by utilizing the five unit, unit distance code of stage 10 in all of the other stages as well. However, this would naturally require five sensing coils for each stage, or would require an additional magnetic multi-arm pole (or bus bar) of the same variety as the poles 51–54, to provide a magnetic path from each of the other code discs 14–17 to the sensing coil 50. Size, complexity and weight of the encoder per se must therefore be balanced against the additional, relatively low cost of the second encoder 122.

Some provision, within the skill of the art, must be made if serial readout of the output register is employed; for instance, the line 154 may be fed back into the register to reload it as it is read out.

Modification of the electronics in order to utilize the embodiment of FIGS. 5 and 6 can be achieved in any number of ways which are well within the skill of the art. Since only the four bit code is needed, the sensing coil 50, the encoder 124 and the gates 136 can be eliminated. As illustrated in FIG. 11, an electric signal from the coil 60, which results concomitantly with electric signals from the sensing coils 46–49 in FIGS. 5 and 6, is amplified and level detected, and utilized to enable an AND circuit 163 so that the T1 signal on the line 84 will provide a gating signal on a line **84*a* to be applied to an OR circuit 164 in order to provide the unlatch signal on the line 106 during time T1 only when the magnetic chopper indicates that the low order stage is at a given one of ten discrete positions. This will cause the low order stage 10*a* to advance in the manner described with respect to FIGS. 1–4 hereinbefore. In other cases, the AND circuit 114 will provide signals to the OR circuit 164 as described with respect to FIG. 8,** hereinbefore.

Figure 12:
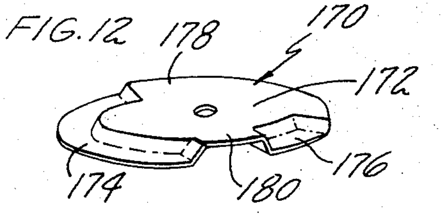
FIG. 12 is a perspective of an alternative code disc.

An alternative form of code disc is illustrated in FIG. 12. Therein, code disc 170 has its primary surface 172 in one plane, and selected sectors 174, 176 in a lower plane, as viewed in FIG. 12, whereby the disc 170 will selectively make low reluctance magnetic paths with respect to various of the poles 51–55 as illustrated in FIG. 1. Of course, a similar disc could be provided in the opposite way. That is, the general plane 172 could be in the same plane with the sectors 174 or 176, and the sectors which are not to establish magnetic circuits (178, 180) may be displaced away from the general plane 172, if desired. An alternative form of code disc may include a non magnetic material having magnetic pole pieces applied to selected sectors thereof, which may be desirable to reduce the weight of the device, if desired. However, since the typical watt-hour meter has shafts on 0.6 inch centers, the code discs are typically on the order of a four-tenths of an inch in diameter, so that the weight thereof is generally not too significant. Thus, the invention may be practiced by providing code discs in which selected sectors, representative of different discrete rotary positions of the code disc, have magnetically conductive protrusions thereon for selectively making low reluctance magnetic circuits with the poles. Another alternative which may be practiced herein is causing the poles 51–55 to extend axially to the discs, rather than radially as illustrated in FIG. 1.

Although the present invention is disclosed with a decaded encoder (working in powers of ten in each stage), it should be obvious that multi-ordered encoders encompassing the present invention may be implemented with other radices, such as octal, hexidecimal, and the like. The significant thing is that the present invention is oriented toward a multi-stage encoder where the maximum count of one stage is equal to a unitary discrete fractional count of the next higher ordered stage thereto (in the sense that the disclosed embodiment is decaded). Thus the invention may be utilized with any plurality of radix-ordered shafts.

It should be borne in mind that the electronic circuitry illustrated in FIGS. 7–9 is exemplary merely, and that other variations in the control and read out functions may be provided as desired. Similarly, although the invention has been shown and described with respect to a variety of embodiments thereof, it should be understood by those skilled in the art that the foregoing and various other changes and omissions in the form and detail thereof may be made therein without departing from the spirit and the scope of the invention.

Having thus described typical embodiments of my invention, that which I claim as new and desire to secure by Letters Patent of the United States is:

1. A radix-ordered multi-stage shaft angle encoder, comprising:

a plurality of stages, each including a rotatable shaft;

a plurality of magnetic circuit poles disposed at respective angular positions about each of said shafts;

a code disc for each of said stages, each rotatably disposed coaxially with respect to the related one of said shafts, each having a plurality of sectors representative of discrete rotary positions of said code disc, selected ones of said sectors of each disc including magnetically conductive protrusions adapted to provide selected low reluctance magnetic circuits with respect to different combinations of said magnetic circuit poles at different rotary positions of said disc;

a plurality of electromagnets, one for each of said stages, each for inducing a magnetic flux into the low reluctance magnetic circuits established by the related one of said code discs; and sensing means responsive to the flux established in each of said magnetic circuits by said electromagnets for providing signals representative of the angular position of the related one of said code discs, said sensing means comprising a single set of magnetic sensing coils for all of said stages, each coil corresponding to one of the angular positions of said magnetic circuit poles, the magnetic circuit poles of each of said stages being in magnetic communication with like poles of the other of said stages and the related one of said magnetic sensing coils.

2. A radix-ordered multi-stage shaft angle encoder, comprising:

a plurality of stages, each including a rotatable shaft, at least one of said stages comprising a discrete advancement stage in which the associated code disc is disposed for rotation about but independently of the related shaft;

a plurality of magnetic circuit poles disposed at respective angular positions about each of said shafts;

a code disc for each of said stages, each rotatably disposed coaxially with respect to the related one of said shafts, each having a plurality of sectors representative of discrete rotary positions of said code disc, selected ones of said sectors of each disc including magnetically conductive protrusions adapted to provide selected low reluctance magnetic circuits with respect to different combinations of said magnetic circuit poles at different rotary positions of said disc;

a plurality of electromagnets, one for each of said stages, each for inducing a magnetic flux into the low reluctance magnetic circuits established by the related one of said code discs;

sensing means responsive to the flux established in each of said magnetic circuits by said electromagnets for providing signals representative of the angular position of the related one of said code discs; and means normally operative to impede rotation of the code disc of each of said discrete advancement stages and selectively operable to cause a selected one of the related discs to advance to the rotary position of the corresponding shaft.

3. An encoder according to claim 2 wherein said last named means further comprises:

means responsive to said sensing means for detecting a predetermined, unique position of the code disc in one of said stages and in response thereto for causing the code disc of the next higher order stage to advance to the rotary position of the corresponding shaft.

4. An encoder according to claim 2 wherein:

said encoder includes means applying a constant axial magnetic field to the code disc of each of said discrete advancement stages for attracting the code discs to the related structure of the stage and thereby impeding rotation of the code disc; and each of said discrete advancement stages comprises passive magnetic motive means disposed to provide a rotary force to the related code disc with respect to the rotary position of the corresponding shaft, and means for selectively applying to the related code disc an axial magnetic field substantially equal and opposite to said constant axial magnetic field, thereby to allow said code disc to rotate in response to said rotary force.

5. An encoder according to claim 4 wherein said passive magnetic motive means comprises a pair of permanent magnets disposed for mutual repulsion, one of said magnets disposed on the related code disc and the other of said magnets disposed for revolution with said shaft.

6. An encoder according to claim 4 wherein said passive magnetic motive means comprises a pair of mutually attracting elements including a permanent magnet element in a ferromagnetic element, one of said elements disposed on the related code disc and the other of said elements disposed for revolution with said shaft.

7. An encoder according to claim 4 wherein said means for selectively applying to the related code disc an axial magnetic field substantially equal and opposite to said constant magnetic field comprises the electromagnets related to each of said discrete advancement stages; and wherein said means normally operative to prevent rotation of the code discs and selectively operable to cause selected discs to advance further comprises means responsive to said sensing means for detecting a predetermined, unique position of the code disc of one of said stages and in response thereto for providing a current pulse to the one of said electromagnets related to the next higher order stage, thereby to allow the related disc to move.

8. An encoder according to claim 4 wherein said means for applying said constant axial magnetic field includes a ferromagnetic mounting base on which said encoder is disposed.

9. An encoder according to claim 8 wherein said means applying a constant axial magnetic field further comprises permanent magnet means disposed on said mounting base.

10. An encoder according to claim 8 wherein said permanent magnet means comprises the cores of the electromagnets of said discrete advancement stages, said cores having remanent magnetic flux therein.

11. An encoder according to claim 9 wherein said permanent magnet means comprises a single, separate magnet disposed remote from, and operative to provide said constant axial magnetic field to, all of said stages.

12. An encoder according to claim 4 wherein said means applying a constant axial magnetic field comprises the cores of the electromagnets of said discrete advancement stages, said cores having remanent magnetic flux therein.

13. An encoder according to claim 2 wherein all of said stages except the lowest-ordered stage comprise discrete advancement stages and wherein said lowest ordered stage comprises a code disc and magnetic circuit poles defining a unit distance code, said code disc disposed for rotation with the lowest ordered shaft.

14. An encoder according to claim 2 wherein all of said stages comprise discrete advancement stages and wherein said lowest ordered stage further comprises a magnetic transition detector providing discrete signals indicative of central portions of the discrete rotary positions of said shaft for synchronizing the reading of said sensing means with respect to said lowest ordered stage.

* * * * *